(12) United States Patent
Baldauf et al.

(10) Patent No.: US 7,952,362 B2
(45) Date of Patent: May 31, 2011

(54) DEVICE FOR MEASURING THE LOSS FACTOR

(75) Inventors: Stefan Baldauf, Rankweil (AT); Rudolf Blank, Sulz (AT)

(73) Assignee: B2 Electronics GmbH, Klaus (AT)

( * ) Notice: Subject to any disclaimer, the term of this patent is extended or adjusted under 35 U.S.C. 154(b) by 120 days.

(21) Appl. No.: 12/081,683

(22) Filed: Apr. 18, 2008

(65) Prior Publication Data

US 2008/0224713 A1    Sep. 18, 2008

Related U.S. Application Data

(63) Continuation of application No. PCT/AT2006/000418, filed on Oct. 11, 2008.

(30) Foreign Application Priority Data

Oct. 19, 2005    (AT) .................................. 1713/2005

(51) Int. Cl.
   *H01H 31/12*    (2006.01)
   *H02H 5/04*    (2006.01)

(52) U.S. Cl. ............................ 324/543; 324/551; 361/23

(58) Field of Classification Search .................. 324/543, 324/551; 361/23
   See application file for complete search history.

(56) References Cited

U.S. PATENT DOCUMENTS

| | | | |
|---|---|---|---|
| 3,189,818 A * | 6/1965 | Frakes | 324/551 |
| 3,826,981 A | 7/1974 | Ross | |
| 4,112,354 A | 9/1978 | Bahder et al. | |
| 4,200,835 A * | 4/1980 | Anahara et al. | 324/509 |
| 4,316,254 A | 2/1982 | Levin et al. | |
| 4,794,327 A * | 12/1988 | Fernandes | 324/126 |
| 5,117,191 A * | 5/1992 | Saigo et al. | 324/551 |
| 5,287,062 A * | 2/1994 | Pellegrin et al. | 324/551 |
| 5,798,853 A | 8/1998 | Watanabe | |
| 6,323,652 B1 * | 11/2001 | Collier et al. | 324/508 |
| 2004/0253921 A1 | 12/2004 | Turner | |

FOREIGN PATENT DOCUMENTS

| | | |
|---|---|---|
| DE | 43 11 614 | 10/1993 |
| DE | 195 19 744 | 12/1996 |
| DE | 100 19 574 | 10/2001 |
| EP | 0 745 8622 | 12/1996 |
| EP | BE 0745862 | * 12/1996 |
| EP | 1 376 142 | 1/2004 |
| JP | 63-266366 | 11/1988 |
| WO | 2004/028003 | 4/2004 |

OTHER PUBLICATIONS

Corrected IDS of Apr. 18, 2008.*
International Search Report issued Mar. 23, 2007 in the International (PCT) Application of which the present application is the U.S. National Stage.

(Continued)

*Primary Examiner* — Melissa J Koval
*Assistant Examiner* — Farhana Hoque
(74) *Attorney, Agent, or Firm* — Wenderoth, Lind & Ponack, L.L.P.

(57) ABSTRACT

A device for measuring the loss factor and/or measuring the phase angle between a voltage and a current and/or recording a voltage decay and/or current decay and/or recording partial discharge processes and/or measuring the propagation time on test objects that are to be tested, includes a housing in which at least one measuring circuit is arranged for measuring and/or recording purposes. A terminal adapter (12) is provided on the housing (9) to connect the test object that is to be tested directly to the housing (9).

38 Claims, 6 Drawing Sheets

OTHER PUBLICATIONS

Austrian Search Report issued Nov. 13, 2006 in the corresponding Austrian patent application.

"Model Paxlhv-Pax Lite AC Voltage Monitor", Oct. 2002, Red Lion Controls, XP002424671, http://www.redlion.net/Products/Groups/ACVolt/PAXLHV/Docs/04028.pdf.

Fluke Networks, Spezifikationen und Bestellinformationen für OptiFiber.

JDSU, Acterna Test & Measurement Solutions, T-BERD 6000 Compact Optical Test Platform, www.jdsu.com.

\* cited by examiner

DEVICE FOR MEASURING THE LOSS FACTOR

This application is a continuation of International Application No. PCT/AT2006/000418, filed Oct. 11, 2006.

The present invention concerns a device for measuring the loss factor and/or for measuring the phase angle between a voltage and a current and/or for recording a decay process of the voltage and/or the current and/or for recording partial discharge processes and/or for transit time measurement on measurement objects to be tested, wherein the device comprises a housing in which there is arranged at least one test circuit for carrying out the measurement and/or recording operation.

Previously known systems of the generic kind set forth are connected with a dedicated feed line to a voltage generator and in turn with a dedicated line to the test object. Furthermore, dedicated grounding lines are additionally also necessary between the generator, the test device and the test object. Particularly when relatively high operating voltages are involved the generally very long cables used give rise to disturbances in the measurement procedures and thus falsification of the measurement values due to parasitic effects, leakage currents, interference phenomena and so forth.

The object of the invention is to provide a device of the generic kind set forth, in which said disturbances in measurement and falsification of the measurement values are minimized as far as possible by constructive features.

In accordance with the invention that is attained in that a connecting adaptor for direct connection of the test object to the housing is provided on the housing.

In that respect the expression direct connection is used to mean that the connecting adaptor is to be kept as short as possible. Therefore, immediate connection of the test object to the housing and thus a spacing of 0 mm is preferred. For purely geometrical reasons however, in order to permit connection to the test object, it is frequently necessary for the connecting adaptor to be of a length of at most between 10 mm and 50 mm. When dealing with test objects which are difficult to access however it may also be the case that connecting adaptor lengths of up to 1 mm are required. All that is to be interpreted as direct connection to the housing, in the sense of the present invention. The invention makes it possible to carry out the measurement operation without the long additional connecting lines to the measurement object, which are known in the state of the art, and that leads to the avoidance of interference effects and thus affords more precise measurement values. In addition the connecting expenditure is reduced by virtue of the connecting adaptor.

In order still further to prevent interference signals from having an effect, a further aspect of the invention provides that the device has a coaxial cable which is provided for connection of the housing to a voltage generator and which has at least one internal conductor and at least one external conductor. It is particularly desirable in that respect if the coaxial cable is guided as such into the housing, wherein it is only within the housing that the internal conductor and the external conductor are connected, preferably separately from each other, to components of the test circuit.

In accordance with that aspect of the invention, only a single coaxial cable is provided between the voltage generator and the housing, the cable preferably being divided up for connection to the test circuit only in the interior of the housing. That affords an optimum screening effect whereby the interference influences are reduced as far as possible.

By virtue of the measures according to the invention, it is possible to provide a highly compact test device which can be handled well. In that respect the housing can desirably be in the form of a preferably cylindrical cable head into which the coaxial cable is introduced at the rear end and the test object can be connected directly at the front end.

The devices according to the invention can preferably be used in what is referred to as the high voltage sector. Test objects are for example capacitors, inductors, resistors and in particular high voltage cables, transformers, motors, generators, switches and relays. Reference is made to high voltage in relation to effective values of the measurement voltages of at least 500 V (volts), preferably at least 1 kV (kilovolts). Measurement voltages with effective values of between 12 kV and 36 kV are particularly suitable for the specified test objects so that the devices according to the invention are preferably designed for that voltage range. Frequencies in respect of the ac voltages of between 0.001 Hz (hertz) and 1 kHz (kilohertz) are preferably provided in that respect. Still higher voltages can also be implemented by adaptation of the housing dimensions.

BRIEF DESCRIPTION OF THE DRAWINGS

Further details and features of the present invention are described hereinafter by means of the embodiments by way of example of the invention which are illustrated in the Figures in which.

DETAILED DESCRIPTION OF THE INVENTION

Figure 1:
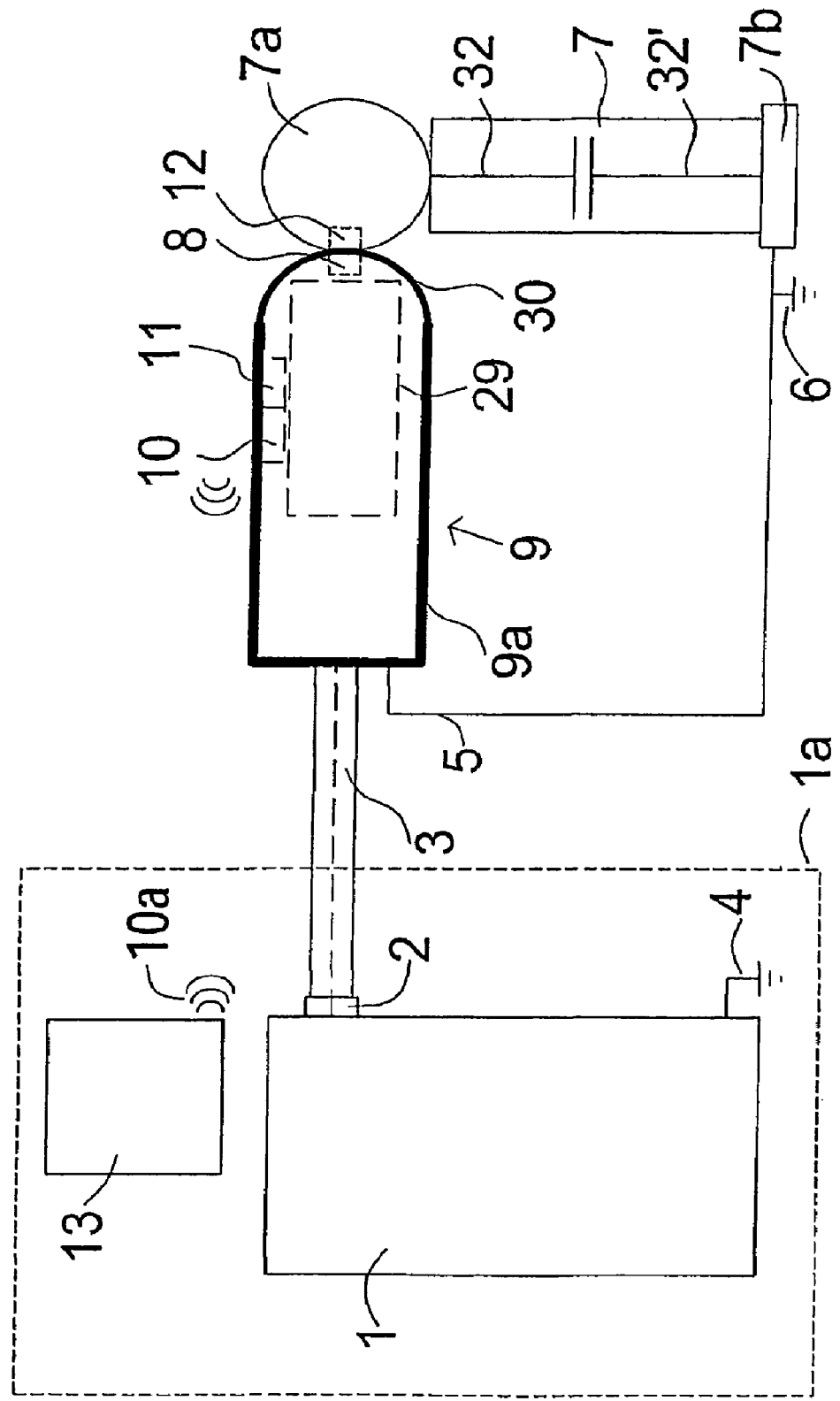
FIGS. 1 and 2 show an arrangement comprising a high voltage generator and an embodiment according to the invention of the test device which in turn is connected to two different test objects.

As illustrated in the Figures, in these embodiments the housing 9 is in the form of a cable head. At the rear end the coaxial cable 3 opens into the cable head or the housing 9. At the front end towards the test object 7 the otherwise cylindrical housing 9 has an electrically conductive, preferably metal closure cap 30 which is in the shape of a part-spherical shell and in which there is provided a connection 8 for the connecting adaptor 12 or the connecting adaptor 12 itself, connected in electrically conducting relationship with the cap 30. It is generally advantageously provided that the connecting adaptor 12 can be electrically and/or mechanically connected in removable form to the measurement object 7 to be tested and/or to the closure cap 30. That can be embodied by way of a plug connection and/or by way of a suitable screw connection and/or by way of a clamping connection or the like. The shape of the connecting adaptor 12 is to be different, depending on the respective test object. Thus, it is possible to provide configurations for the connecting adaptor in the form of hooks and/or clamps and/or short, preferably highly flexible connecting lines. In general in that respect however in accordance with the invention it is to be noted that the connecting adaptor is kept as short as possible in order to permit a connection which is as direct as possible for the test object 7, to the housing 9 or the closure cap 30 thereof.

Except for the closure cap 30 the housing can be made of electrically insulating material, for example in the form of a plastic housing 9a. In general therefore the housing is of a two-part structure.

The coaxial cable which leads out of the cable head or the housing 9 at the rear thereof is connected by way of a plug connector 2 or the like to a commercially available voltage generator or high voltage generator 1. Those generators generally have their own protective ground terminal 4. To measure the loss factor and/or the phase angle between voltage and current, ac (high) voltage generators with a sinusoidal output voltage are preferably used.

FIG. 1 diagrammatically shows a measurement situation in which a capacitor is to be checked, as the test object 7. In this case the connecting adaptor 12 is connected directly to a spherical high voltage connection 7a of the feed line 32 of the capacitor. The other feed line 32' of the capacitor is electrically connected to a protective ground terminal 7b for the test object 7. The protective ground terminal 7b of the test object as also the optionally present protective ground cable 5 of the test device are electrically conductingly connected to an external protective ground terminal 6.

Figure 2:
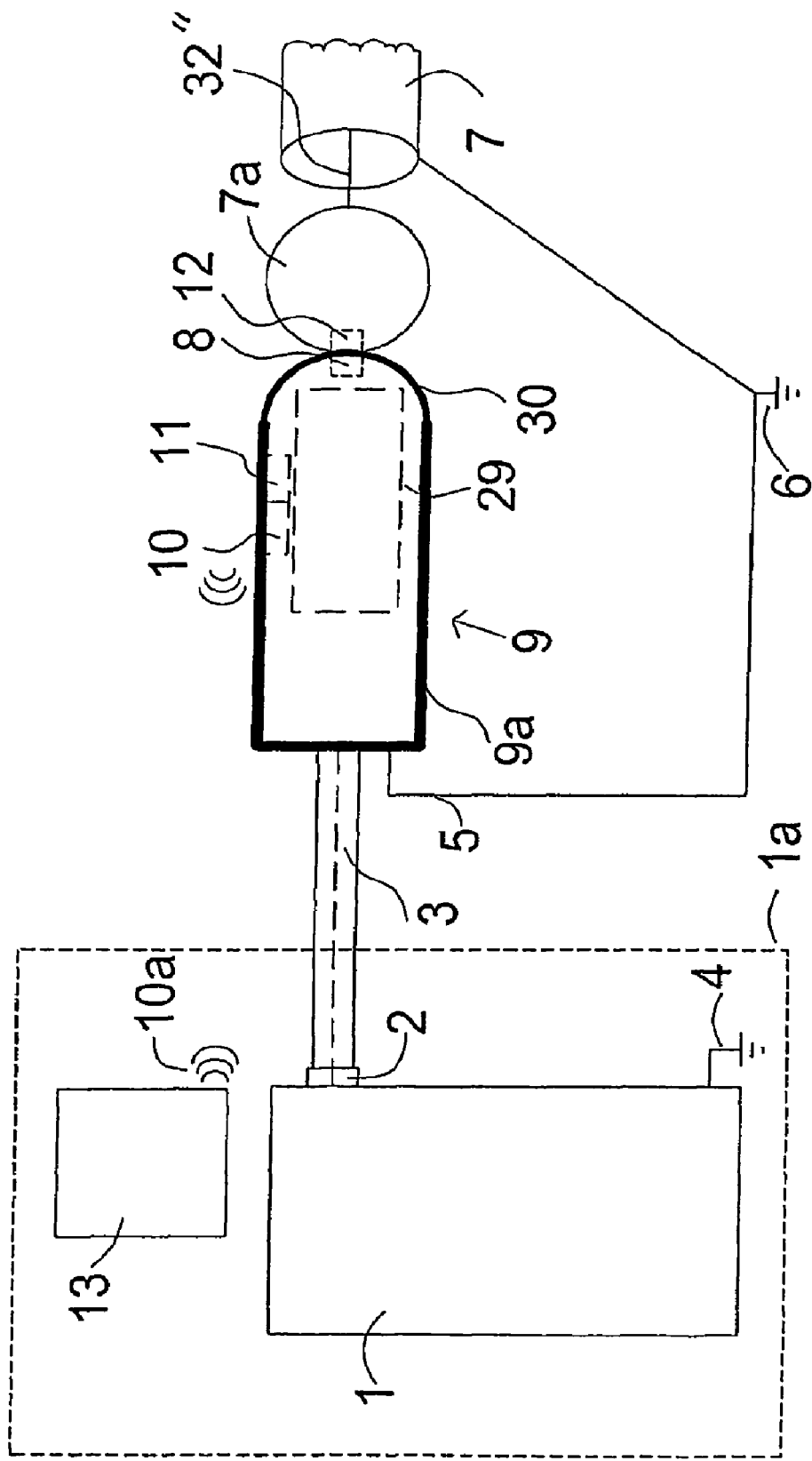

FIG. 2 diagrammatically shows a measurement situation which involves checking a high voltage cable as the test object 7. Here the connecting adaptor 12 is connected directly to a spherical high voltage connection 7a of the line cable 32" of the test object 7. In both embodiments (as shown in FIGS. 1 and 2) the presence of the spherical high voltage connections 7a is optional.

Figure 3:
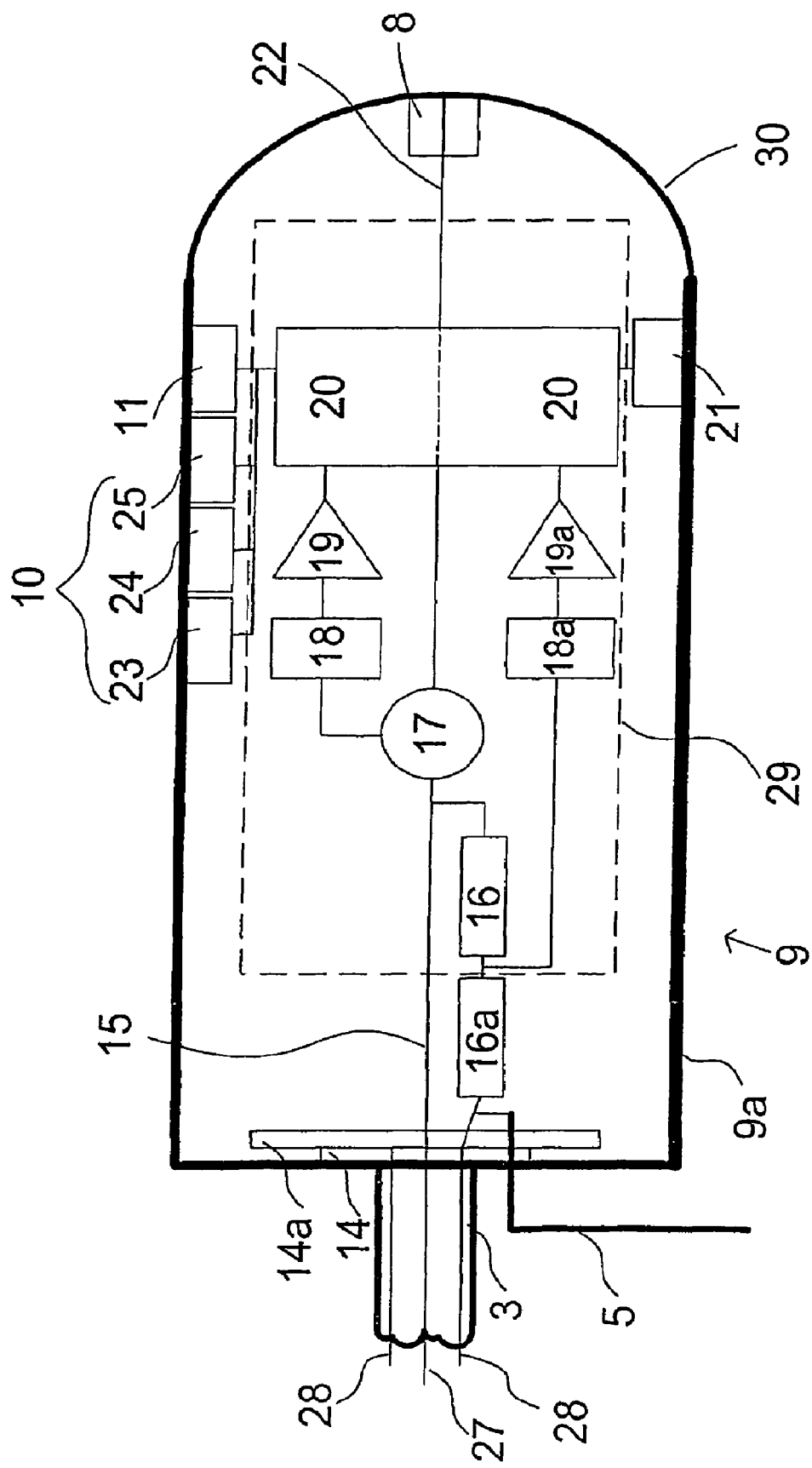
FIG. 3 shows a diagrammatic section through an embodiment according to the invention of a test device as shown in FIGS. 1 and 2 for determining the loss factor and/or the phase angle between current and voltage.

FIG. 3 shows, by way of the example of a device for measuring the loss factor and/or the phase angle between voltage and current, a diagrammatic longitudinal section through the housing 9 and the coaxial cable 3 opening therein. The latter passes in closed form, that is to say in the form of a coaxial cable, into the interior of the housing 9 and is only there connected to the corresponding components of the test circuit disposed in the interior of the housing 9. In the illustrated embodiment the shielding, that is to say the external conductor 28, of the coaxial cable 3 is connected by way of a field control plate 14a to an ohmic voltage divider. It has a low voltage element 16 and a high voltage element 16a. The tapping from the voltage divider is effected by way of an overvoltage protection 18a in the voltage signal path which is connected to the evaluation unit 20 by way of a filter and an amplifier 19a. The current detection device 17 (passive or active possible) is connected by way of the high voltage termination 14 and a feed line 15 to the internal conductor 27 of the coaxial cable 3. By way of the current signal path, the current detection device 17 is connected to an overvoltage protection 18 and a filter and amplifier 19 connected in series therewith, to the evaluation device 20. In addition a feed line 22 goes from the current detection device 17 around the evaluation unit 20 to the connection 8 for the connecting adaptor 12. The illustrated structure provides that integration of the test circuit into the cable head and incorporation of the voltage divider and the current detection device 17 directly into the cable run are possible. The evaluation unit 20 and further components of the test circuit are shielded by a metal housing 29 from external electrical fields. The evaluation unit 20 desirably includes at least one A/D converter and/or a digital filter device or signal processing device and/or a calculating device for calculating the loss factor and/or the phase angle between voltage and current. In general therefore the endeavor is to afford digital evaluation of the measurement values, for which purpose a microprocessor can be used. The structure of the test circuit and the manner of evaluation of the measured current and voltage signals is known per se so that there is no need for further description in that respect here.

For rapid measurement or an initial overview measurement the illustrated embodiment provides an optical measurement value display 11 on the housing 9. It can be in the form of light emitting diodes. Alternatively it would also be possible to provide an acoustic measurement value output. Furthermore, in addition to or instead thereof, it is possible to arrange on the housing 9 at least one data transfer device 10 for the transfer of data to external data processing and/or data display devices 13 such as for example PCs (personal computers), laptops, Pocket PCs, cellular telephones, PDAs, handhelds, printers and the like. Transfer to those external devices can be implemented both by a wired system or wirelessly. Possible options are inter alia radio interfaces 23, preferably in the high frequency range such as for example Bluetooth interfaces, and/or optical wireless interfaces 24 such as for example infrared interfaces and/or optical wired interfaces 25 such as for example optical fiber interfaces. The external data processing and/or data display device 13 can also be integrated into the generator 1, as shown in FIGS. 1 and 2. For data transmission it at any event has one or more suitable interfaces 10a. The test circuit is preferably supplied by battery 21, thereby permitting current detection which is dissociated from the protective ground.

The optionally provided protective ground cable 5 is connected within the housing to the external conductor 28 and leads as such out of the housing 9 in order to be able to be connected to an external protective ground terminal 6. In this case also attention is to be paid to a line length which is as short as possible. Further suppression of interference influences can be achieved by the protective ground cable 5. The cable 5 however does not have to be provided. The reference potential of the measuring arrangements or test circuits shown in FIGS. 3 through 6 is the high voltage. In that respect the measuring arrangement includes in particular the components respectively shown within the housing 29 and/or the housing 29 itself. In that respect the term high voltage is used to denote in particular effective values in respect of the voltages of at least 500 V, preferably at least 1 kV, in relation to the protective earth. In particular however effective values in respect of the voltages in relation to the protective earth of between 12 kV and 36 kV can also be included in that sense by the term high voltage. Desirably the measuring arrangement or test circuit is thus at high voltage in relation to the protective ground. In principle however the measuring arrangement shown in FIG. 3 can also be modified in such a way that the protective ground represents the reference potential. The high voltage potential is preferred however for structural reasons and reasons relating to measurement technology.

Figure 4:
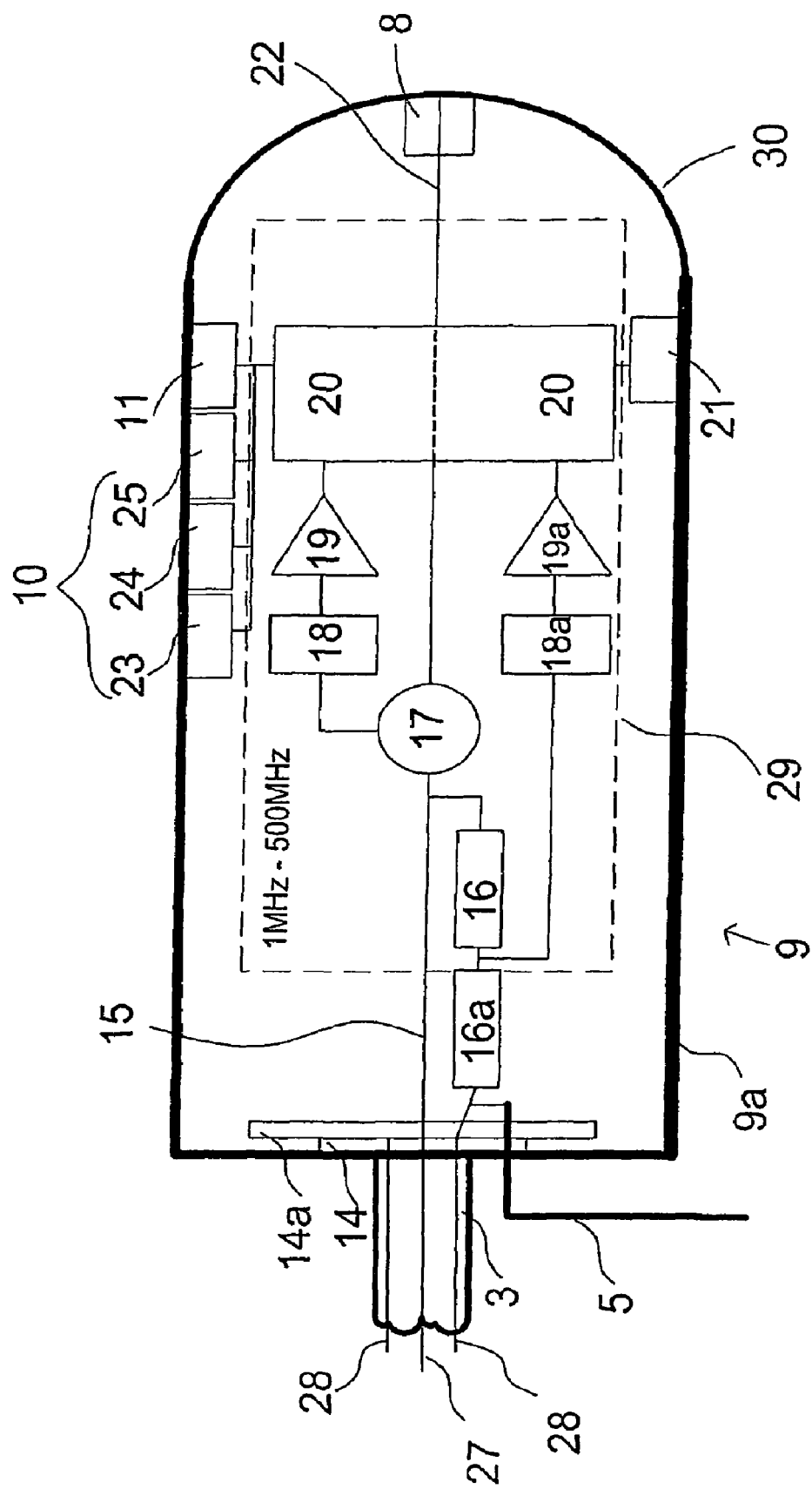
FIG. 4 shows a diagrammatic section through an embodiment according to the invention of a test device as shown in FIGS. 1 and 2 for the recordings of a decay process of the voltage and/or the current.
Figure 5:
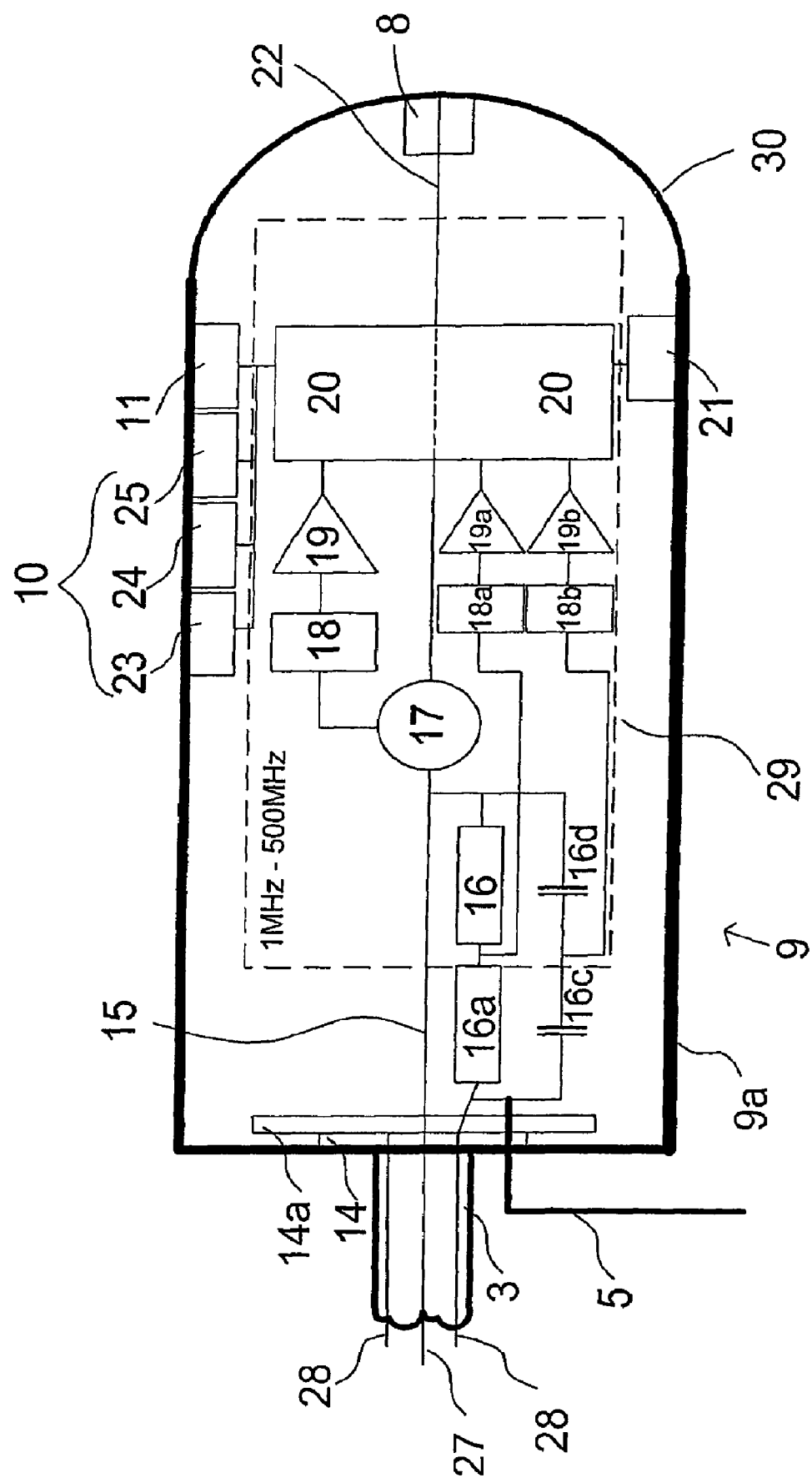
FIG. 5 shows a diagrammatic section through an embodiment according to the invention of a test device as shown in FIGS. 1 and 2 for the recording of partial discharge processes.
Figure 6:
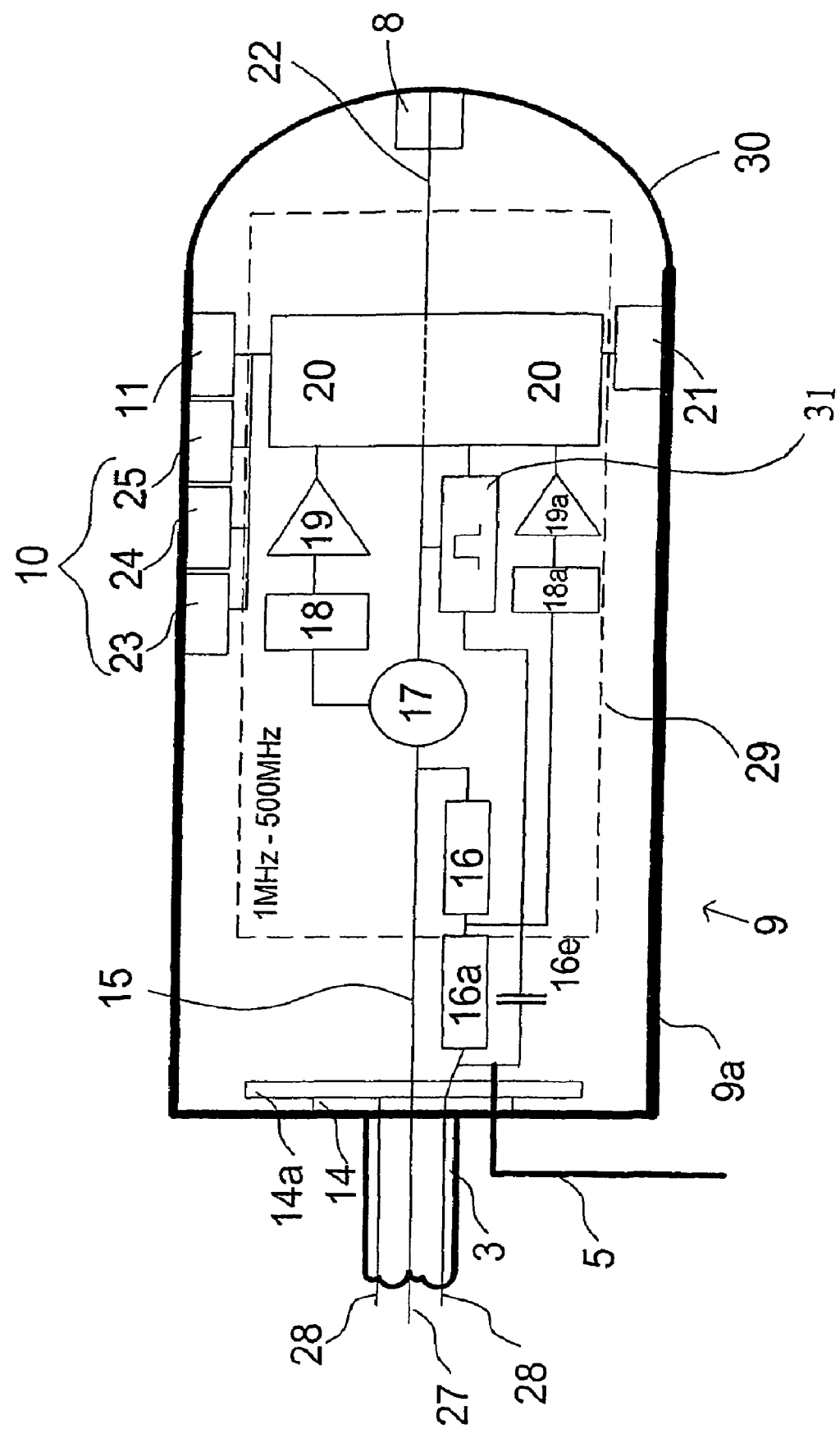
FIG. 6 shows a diagrammatic section through an embodiment according to the invention of a test device as shown in FIGS. 1 and 2 for transit time measurement.

FIGS. 4 through 6 show variants in which the device according to the invention is so designed that it can be used as a so-called transient recorder for cable fault pre-location. If a cable fault occurs it firstly has to be located. That applies in particular in relation to very long cables which are several kilometers in length. In order to narrow down the cable fault, there are various field measurement processes which are known in the state of the art but which ultimately are all based on the evaluation of transient processes. Depending on the respective measurement processes and boundary conditions, the fault in the cable can be located with an accuracy to between about one and five meters. The procedure generally then switches over to post-location of the source of the fault, and other measurement processes which are known in the state of the art but which are not further discussed here are used for that purpose.

FIG. 4 shows a variant according to the invention of a device for recording a decay process of the voltage or a current surge. Accordingly voltage generators for sinusoidal ac voltages or current surge generators are also used as the generators 1. In principle, a similar configuration to the test circuit shown in FIG. 3 is possible for recording and evaluating those decay processes. It will be noted however that, as shown in FIG. 4, the circuit must be so adapted that it is also possible to record relatively fast processes. In general terms it is necessary in that respect for the circuit to be so designed that sampling frequencies of at least 1 MHz, preferably between 1 MHz (megahertz) and 500 MHz, or also over 500 MHz, are possible. If that is the case then this device (as shown in FIG. 4) can also be used as a transient recorder for recording and evaluating decay processes in cable fault location.

FIG. 5 shows an embodiment according to the invention which is suitable for partial discharge diagnosis, that is to say for recording partial discharge processes in test objects such as for example cables. For that purpose the ohmic voltage divider 16, 16a already known from FIG. 3 is replaced by a capacitive voltage divider 16c (high voltage element), 16d (low voltage element) or, as shown in FIG. 5, supplemented by parallel connection. The system modified in that way can then in turn be used as a transient recorder for recording partial discharge processes, in which respect it should be taken into consideration that coupling to the cable itself should be low in terms of partial discharge. Here too, suitably fast electronic components with sampling frequencies of at least 1 MHz, preferably between 1 MHz and 500 MHz, or also over 500 MHz, are to be used. With this basically known measurement process, the transit time as well as the partial discharge level of the signal which is produced upon partial discharge in the cable for example at a fault location is recorded.

FIG. 6 shows a further modified embodiment of the invention. This is also suitable for transit time measurement in the test object (for example in the cable to be tested). It will be noted however that in the system shown in FIG. 6 a dedicated pulse generator 31 is integrated into the test circuit by way of a coupling capacitor 16e. Accordingly transit times of signals generated by the pulse generator in the test object can be determined. The unit formed in that way can be employed as a transit time test device with integrated high voltage coupling. Cable fault pre-location is then possible on the basis of the measured transit times. Here too the test circuit should be suitable for operating with sampling frequencies of at least 1 MHz, preferably between 1 MHz and 500 MHz, or also over 500 MHz. The device according to the invention which is designed in that way is also connected like the embodiment of FIG. 5 to voltage generators 1 or high voltage generators with a sinusoidal output signal or an output signal in surge form.

The measures according to the invention provide devices which can be handled very well and which can be connected directly to the test objects 7 and the weight of which is desirably between 3 kg and 5 kg or less. The use of coaxial cable 3 between the housing 9 and the voltage generator 1 provides for optimum shielding of the feed line to the test circuit, whereby the maximum length of the line 3 is virtually unlimited even in the high voltage range. Typical cable lengths are between 5 m and 100 m. Interference influences are additionally substantially eliminated by the coaxial cable 3 being introduced into the interior of the housing 9. As a modification of the illustrated embodiment however it is also possible to provide a suitable connecting plug having its own housing on the coaxial cable 3, in which case the plug is then plugged directly into the housing of the test device. That is also to be interpreted as introducing the coaxial cable 3 into the housing 9.

The invention claimed is:

1. A device for testing a test object, wherein testing can be carried out through at least one testing operation selected from the group consisting of:
   measuring the loss factor,
   measuring the phase angle between a voltage and a current,
   recording a decay process of the voltage,
   recording a decay process of the current,
   recording partial discharge processes, and
   measuring the transit time;
wherein the device comprises:
   a housing in which there is arranged at least one test circuit for carrying out the testing operation, the at least one test circuit comprising an ohmic voltage divider and a current detection device;
   a voltage generator;
   a coaxial cable which connects the housing to the voltage generator such that the housing and the voltage generator are spaced apart and arranged remotely from each other at least during the testing operation, the coaxial cable comprising an internal conductor connected to the current detection device and an external conductor connected to the ohmic voltage divider; and
   a connecting adaptor for direct connection of the test object to the housing, wherein the connecting adaptor is provided on the housing.

2. A device as set forth in claim 1, wherein the connecting adaptor can be electrically and/or mechanically connected removably to the test object and/or to the housing.

3. A device as set forth in claim 1, wherein the connecting adaptor has at least one of a hook, a clamp and a short connecting line.

4. A device as set forth in claim 3, wherein the connecting adaptor has at least one of a hook, a clamp and a short, highly flexible connecting line.

5. A device as set forth in claim 1, wherein the connecting adaptor is at most 1 m long.

6. A device as set forth in claim 5, wherein the connecting adaptor is at most between 10 mm and 50 mm long.

7. A device as set forth in claim 1, wherein it is only within the housing that the internal conductor is connected to the current detection device and that the external conductor is connected to the ohmic voltage divider.

8. A device as set forth in claim 7, wherein the internal conductor and the external conductor are connected separately from each other to the current detection device and the ohmic voltage divider, respectively.

9. A device as set forth in claim 1, wherein the at least one test circuit has a capacitive voltage divider.

10. A device as set forth in claim 9, wherein at least one of the ohmic voltage divider and the capacitive voltage divider comprises a low voltage element and a high voltage element.

11. A device as set forth in claim 9, wherein the capacitive voltage divider is connected to the external conductor of the coaxial cable.

12. A device as set forth in claim 1, wherein the at least one test circuit comprises a central evaluation unit.

13. A device as set forth in claim 12, wherein the central evaluation unit has at least one A/D converter and/or a digital filter device or a signal processing device and/or a calculating device for calculating the loss factor and/or the phase angle between voltage and current.

14. A device as set forth in claim 12, wherein the central evaluation unit includes a microprocessor.

15. A device as set forth in claim 1, wherein the at least one test circuit has a clock frequency of at least 1 MHz.

16. A device as set forth in claim 15, wherein the at least one test circuit has a clock frequency between 1 MHz and 500 MHz.

17. A device as set forth in claim 15, wherein the at least one test circuit is suitable for recording transient processes in cable fault location.

18. A device as set forth in claim 1, wherein the at least one test circuit comprises a pulse generator.

19. A device as set forth in claim 1, further comprising:
at least one of an optical measurement value display and an acoustic measurement value output display arranged at the housing.

20. A device as set forth in claim 19, wherein the optical measurement value display comprises light emitting diodes.

21. A device as set forth in claim 1, further comprising:
at least one data transfer device for the transfer of data to external data processing and/or data display devices, the at least one data transfer device being arranged in or on the housing.

22. A device as set forth in claim 21, wherein the data transfer device has at least one of an optical wireless interface, an optical wired interface, and a radio interface.

23. A device as set forth in claim 22, wherein the at least one of the optical wireless interface, optical wired interface and radio interface comprises an infrared interface, an optical fiber interface or a Bluetooth interface, respectively.

24. A device as set forth in claim 1, further comprising: a protective ground cable for connection to an external protective ground terminal, the protective ground cable being connected to the external conductor.

25. A device as set forth in 24, wherein the protective ground cable is connected to the external conductor within the housing.

26. A device as set forth in claim 1, wherein the housing is at most 500 mm long and/or has a maximum cross-sectional diameter of at most 100 mm.

27. A device as set forth in claim 26, wherein the housing is at most 300 mm long and/or has a maximum cross-sectional diameter of at 70 mm.

28. A device as set forth in claim 1, wherein the at least one test circuit is suitable for effective values of measurement voltages of at least 500 V.

29. A device as set forth in claim 28, wherein the at least one test circuit is suitable for effective values of measurement voltages of at least 1 kV.

30. A device as set forth in claim 1, wherein the at least one test circuit is suitable for effective values of measurement voltages of between 12 kV and 36 kV.

31. A device as set forth in claim 1, wherein a reference potential of the at least one test circuit in relation to the protective ground is high voltage.

32. A device as set forth in claim 2, wherein the connecting adaptor can be electrically and/or mechanically connected removably to the test object and/or to the housing by way of at least one of a plug connection, a screw connection and a clamping connection.

33. A device as set forth in claim 1, wherein the coaxial cable is a single coaxial cable, and wherein the housing and the voltage generator are connected to each other only by the single coaxial cable at least during the testing operation.

34. A device as set forth in claim 1, wherein the housing comprises a cable head, the at least one test circuit being arranged within the cable head.

35. A device for testing a test object, wherein testing can be carried out through at least one testing operation selected from the group consisting of:
measuring the loss factor,
measuring the phase angle between a voltage and a current,
recording a decay process of the voltage,
recording a decay process of the current,
recording partial discharge processes, and
measuring the transit time;
wherein the device comprises:
a housing in which there is arranged at least one test circuit for carrying out the testing operation, the at least one test circuit comprising an ohmic voltage divider and a current detection device;
a coaxial cable for connecting the housing to a voltage generator, the coaxial cable comprising an internal conductor connected to the current detection device and an external conductor connected to the ohmic voltage divider;
a connecting adaptor for direct connection of the test object to the housing, wherein the connecting adaptor is provided on the housing; and
a data transfer device for transferring data wirelessly to a data processing or data display device, the data transfer device being arranged on the housing.

36. A device as set forth in claim 35, wherein the housing comprises a cable head, the at least one test circuit being arranged within the cable head.

37. A device for testing a test object, wherein testing can be carried out through at least one testing operation selected from the group consisting of:
measuring the loss factor,
measuring the phase angle between a voltage and a current,
recording a decay process of the voltage,
recording a decay process of the current,
recording partial discharge processes, and
measuring the transit time;
wherein the device comprises:
a housing in which there is arranged at least one test circuit for carrying out the testing operation, the at least one test circuit comprising an ohmic voltage divider and a current detection device;
a voltage generator;
a coaxial cable which connects the housing to the voltage generator such that the housing and the voltage generator are spaced apart and arranged remotely from each other at least during the testing operation, the coaxial cable comprising an internal conductor connected to the current detection device and an external conductor connected to the ohmic voltage divider;
a connecting adaptor for direct connection of the test object to the housing, wherein the connecting adaptor is provided on the housing;
a data processing or data display device integrated into the voltage generator; and
a data transfer device for transferring data to the data processing or data display device, the data transfer device being arranged on the housing.

38. A device as set forth in claim 37, wherein the housing comprises a cable head, the at least one test circuit being arranged within the cable head.

* * * * *